United States Patent [19]

Magill et al.

[11] Patent Number: 5,412,537
[45] Date of Patent: May 2, 1995

[54] ELECTRICAL CONNECTOR INCLUDING VARIABLY SPACED CONNECTOR CONTACTS

[75] Inventors: Paul A. Magill, Chapel Hill; Nicholas G. Koopman, Raleigh; Glenn A. Rinne, Cary, all of N.C.

[73] Assignees: MCNC, Research Triangle Park, N.C.; Northern Telecom Limited, Quebec, Canada

[21] Appl. No.: 202,348

[22] Filed: Feb. 28, 1994

Related U.S. Application Data

[62] Division of Ser. No. 953,564, Sep. 29, 1992, Pat. No. 5,315,485.

[51] Int. Cl.⁶ .............................................. H05K 1/02
[52] U.S. Cl. .................................... 361/777; 361/760; 361/767; 174/261; 174/253; 439/68
[58] Field of Search .................... 174/260, 261, 253; 361/760, 767, 768, 774, 777; 439/68

[56] References Cited

U.S. PATENT DOCUMENTS

| | | | |
|---|---|---|---|
| 3,622,384 | 11/1971 | Davey et al. | 117/212 |
| 3,871,014 | 3/1975 | King et al. | 228/180.21 |
| 3,871,015 | 3/1975 | Lin et al. | 228/180.21 |
| 4,245,273 | 1/1981 | Feinberg et al. | 361/382 |
| 4,296,272 | 10/1981 | Schelhorn | 174/68.5 |
| 4,562,513 | 12/1985 | Arnold et al. | 361/409 |
| 4,581,680 | 4/1986 | Garner | 361/403 |
| 4,677,254 | 6/1987 | Boss et al. | 174/68.5 |
| 4,700,473 | 10/1987 | Freyman et al. | 29/846 |
| 4,755,631 | 7/1988 | Churchwell et al. | 174/68.5 |
| 4,879,156 | 11/1989 | Herron et al. | 428/137 |
| 4,910,643 | 3/1990 | Williams | 361/414 |
| 4,942,079 | 7/1990 | Kumagai et al. | 428/209 |
| 5,019,997 | 5/1991 | Haller | 174/261 |
| 5,061,825 | 10/1991 | Catlin | 174/261 |
| 5,068,596 | 11/1991 | Banura | 323/351 |
| 5,303,116 | 4/1994 | Grotz et al. | 361/111 |

FOREIGN PATENT DOCUMENTS 3-190238  8/1991  Japan .

OTHER PUBLICATIONS

*Multilayer Laminated Circuit Construction*, M. M. Haddad, IBM Technical Bullertin, vol. 7, No. 2, Jul. 1964, pp. 154–155.

Primary Examiner—Michael W. Phillips
Assistant Examiner—L. Thomas
Attorney, Agent, or Firm—Bell, Seltzer, Park & Gibson

[57] ABSTRACT

An electrical connector includes a housing and a row of connector contacts coupled to the housing. The row of connector contacts has a predetermined center-to-center spacing between adjacent contacts, with the predetermined center-to-center spacing being relatively large relatively far from an imaginary reference point in the row of connector contacts, and being relatively small relatively near the imaginary reference point in the row of connector contacts. The imaginary reference point is preferably at the center of the row of contacts, and the center-to-center contact spacing preferably progressively increases from the center of the row to the ends of the row. The size of the connector contacts may also progressively increase as well. The electrical connector is preferably adapted for use with a multilayer ceramic substrate which includes a row of capture pads of the same predetermined center-to-center spacing at the edge thereof. The variable center-to-center spacing ensures electrical connection to a conductor filled via in the multilayer ceramic substrate notwithstanding variability and location of the respective via due to shrinkage of the substrate during fabrication thereof.

21 Claims, 9 Drawing Sheets

ELECTRICAL CONNECTOR INCLUDING VARIABLY SPACED CONNECTOR CONTACTS

This application is a divisional of application Ser. No. 07/953,564, filed Sep. 29, 1992, now U.S. Pat. No. 5,315,485.

FIELD OF THE INVENTION

This invention relates to microelectronic packaging systems and more particularly to multilayer ceramic substrates for high density packaging of integrated circuit devices.

BACKGROUND OF THE INVENTION

Multilayer ceramic substrates are extensively used for high density packaging of semiconductor integrated circuit chips and other microelectronic elements. As is known to those having skill in the art, the multilayer ceramic substrate includes metallurgy which is buried within the substrate, making possible a very complex and intricate wiring interconnection. A multilayer substrate is described in detail in Feinberg et al. U.S. Pat. No. 4,245,273 entitled *Package for Mounting and Interconnecting a Plurality of Large Scale Integrated Semiconductor Devices*.

The multilayer ceramic substrate is fabricated by forming a ceramic slurry, doctor blading the slurry and drying to produce ceramic green sheets. Holes (vias) are punched in the green sheets, and the vias are filled with a conductor. Conductive lines are screened on the green sheets and the green sheets are laminated. The laminated structure is sintered to form a unitary ceramic substrate with a complex internal conductor system including a plurality of conductor filled vias extending to a face thereof.

One face of the multilayer ceramic substrate typically includes an array of capture pads, a respective one of which is electrically connected to a respective one of the conductor filled vias. The capture pads form electrical connections to a multilayer thin film wiring substrate, which is formed on the multilayer ceramic substrate face over the capture pads. Integrated circuit chips are then mounted on the multilayer wiring substrate, opposite the multilayer ceramic substrate. Alternatively, integrated circuit chips may be mounted directly on the capture pads. The capture pads are typically fabricated in the multilayer thin film wiring substrate. Alternatively, they may also be fabricated in the thick film multilayer ceramic substrate. One or more rows of capture pads may also be formed along one or more edges of the substrate face, so that an edge connector may be attached at the substrate edge to provide external electrical connections.

As is well known to those having skill in the art, the ceramic green sheets shrink during the sintering process. This shrinkage is not uniform or predictable across the face of the multilayer ceramic substrate. For example, shrinkage of 12%±3% may be encountered.

Techniques have been developed to reduce the amount and variability of this shrinkage. See for example Boss et al. U.S. Pat. 4,677,254 entitled *Process for Minimizing Distortion in Multilayer Ceramic Substrates and the Intermediate Unsintered Green Ceramic Substrate Produced Thereby*. However, notwithstanding this and other attempts, nonuniform shrinkage continues to be a problem. Other techniques have been developed in an attempt to accommodate the variability of shrinkage which occurs during the fabrication of the multilayer ceramic substrate. See for example Arnold et al. U.S. Pat. 4,562,513 entitled *Process for Forming a High Density Metallurgy System on a Substrate and Structure Thereof*.

Alignment between the capture pads on the substrate face and the conductor filled vias which are electrically connected thereto, must be ensured in order to provide the required electrical connection between the capture pads and the conductor filled vias within the substrate. In order to accommodate the variability in position of the conductor filled vias, due to the nonuniform shrinkage of the multilayer ceramic substrate, oversized capture pads are typically used. In particular, the capture pads are all made large enough to accommodate the worst case variation in via position. Thus, the capture pad will always electrically contact the associated via even if the worst case variability in position is encountered. The capture pads are of the same size, which is set by the worst case via position variation. Because the worst case via position variation must be accommodated, the oversized capture pads limit the number of capture pads which can be formed on the face of a multilayer ceramic substrate. The number of vias which can be formed at the face of the multilayer ceramic substrate is also limited. Connection density is reduced correspondingly.

SUMMARY OF THE INVENTION

It is therefore an object of the invention to provide an improved multilayer ceramic substrate.

It is another object of the invention to provide a multilayer ceramic substrate which allows high density capture pad connections notwithstanding nonuniform substrate shrinkage during fabrication.

These and other objects are obtained according to the present invention, by providing a plurality of capture pads of predetermined size on the face of the multilayer ceramic substrate, wherein the predetermined capture pad size is relatively small relatively near an imaginary reference or neutral point on the substrate face, and is relatively large relatively far from the imaginary reference or neutral point on the substrate face. The imaginary reference or neutral point is a point of assumed minimum or zero shrinkage tolerance variation, from which shrinkage tolerance variation at all other points on the substrate is measured. Typically, the imaginary reference or neutral point is at the center of the substrate face or at the center of a substrate edge, in order to minimize the largest size of the capture pads which are required. However, other reference or neutral points, for example at a corner of a substrate, may be used.

Variable size capture pads are provided, according to the invention, with the size progressively increasing as the distance from the assumed reference or neutral point increases. For a reference or neutral point at the center of the substrate face, the capture pad size progressively increases from the center of the substrate face to the edges of the substrate face. The variable size capture pads accommodate the actual shrinkage tolerance at each capture pad position in the multilayer ceramic substrate. All of the capture pads are not made oversize, to accommodate the worst case nonuniformity expected over the substrate. Rather, by sizing each capture pad based on the maximum positional variation at the particular capture pad position, higher contact density is obtainable than with known uniform size capture pads.

In particular, according to the invention, the variability of via position increases with radial distance from the reference point. Assuming that the center of the substrate defines the reference point, and the variation in shrinkage is a fixed percentage (such as ±3%), then the possible location of the vias varies over a wider distance as the distance from the center increases. In order to insure alignment of the capture pad to the underlying conductor filled via, the capture pad sizes are made progressively larger as the radial distance from the center of the substrate face to the edges increases. Thus, only the outermost capture pads will be large enough to accommodate the worst case variation. The size of inner capture pads is progressively reduced, because smaller variations in via positions will be encountered closer to the center of the substrate. Since the inner capture pads are smaller than the outermost capture pads, larger numbers of capture pads may be accommodated. A higher density substrate is thereby provided, without increasing misalignment between the capture pads and the underlying conductor filled vias.

The variable size capture pads of the present invention may also be used at one or more rows of capture pads located along one or more edges of the substrate for electrical connection to an edge connector. Assuming that the reference or neutral point is in the center of the row, the capture pads are relatively large adjacent the ends of the row of capture pads and are relatively small adjacent the center of the row. In particular, the capture pads progressively increase in size from the center of the row to the ends of the row. Since only the end capture pads are large enough to accommodate the worst case shrinkage, and the capture pad size is reduced towards the center of the row, a larger number of capture pads may be accommodated than would be the case with equal size capture pads. Alternatively, if the reference point is assumed to be at one end of the row, the capture pads increase in size as the distance from the reference point increases, and will be largest at the opposite end of the row. Edge connectors with variable spacing of edge connector contacts are provided to provide high density electrical connections to the multilayer ceramic substrate with variable size capture pads.

The variable size capture pads of the present invention allow more capture pads to be placed on a multilayer ceramic substrate face than would be the case for fixed size capture pads. However, the variable size capture pads will create variable capacitive coupling to the underlying ground plane in the multilayer ceramic substrate, which may degrade the high speed performance of the multilayer ceramic substrate. According to another aspect of the present invention, the variable capacitance problem associated with variable size capture pads is reduced or eliminated to provide uniform capacitive coupling to the ground plane notwithstanding the variable size capture pads.

Uniform capacitive coupling is accomplished, according to the present invention, by providing a uniform size ground plane region adjacent each capture pad, with the uniform size being smaller than the smallest capture pad. Accordingly, ground plane capacitive coupling is governed by the uniform size ground plane regions, notwithstanding the variable size capture pads.

In particular, a plurality of apertures of predetermined size are formed in the internal ground plane of the multilayer ceramic substrate. A respective ground plane aperture is adjacent a respective one of the capture pads. The predetermined aperture size is proportional to the predetermined capture pad size of the capture pad adjacent thereto. Preferably, the predetermined aperture size is at least equal to the size of the capture pad adjacent thereto, so that capacitive coupling between the multilayer ceramic substrate ground plane and the variable size capture pads is minimized.

Ground plane coupling for the capture pads is provided by the ground plane of the multilayer wiring substrate mounted on the multilayer ceramic substrate, or the ground plane of the edge connector which is connected to the edge capture pads. The ground plane of the multilayer wiring substrate or the edge connector includes a plurality of ground plane regions of the same (uniform) size. A respective ground plane region is adjacent a respective one of the capture pads. The same size wiring substrate or edge connector ground plane regions are preferably smaller than the smallest of the capture pads. Accordingly, the capacitive coupling between the ground plane regions and the capture pads is determined by the size of the ground plane regions, which are all uniform size. The capacitive coupling between the capture pad and the ground plane regions is therefor equal, even though the capture pads are of variable size. Signal degradation resulting from variable capacitive coupling to the variable size capture pads is thereby reduced or eliminated.

The variable size capture pads with uniform ground plane capacitive coupling of the present invention allows high density microelectronic circuit packaging. For example, in a four inch square multilayer ceramic substrate with 12% shrinkage and 2% shrinkage tolerance, and a 0.008" capture pad sides and 0.008" spacing between the capture pads, the known fixed size capture pads would allow 166 capture pads at each edge of the substrate. The variable size capture pads according to the present invention allow 204 contact pads at the edge. A 25% increase in connection density is obtained without degrading the performance of the substrate.

DETAILED DESCRIPTION OF A PREFERRED EMBODIMENT

The present invention now will be described more fully hereinafter with reference to the accompanying drawings, in which a preferred embodiment of the invention is shown. This invention may, however, be embodied in many different forms and should not be construed as limited to the embodiment set forth herein; rather, this embodiment is provided so that this disclosure will be thorough and complete, and will fully convey the scope of the invention to those skilled in the art. Like numbers refer to like elements throughout. For greater clarity, the thickness and relative thickness of the layers have been exaggerated, and the figures have not been drawn to scale.

Figure 1:
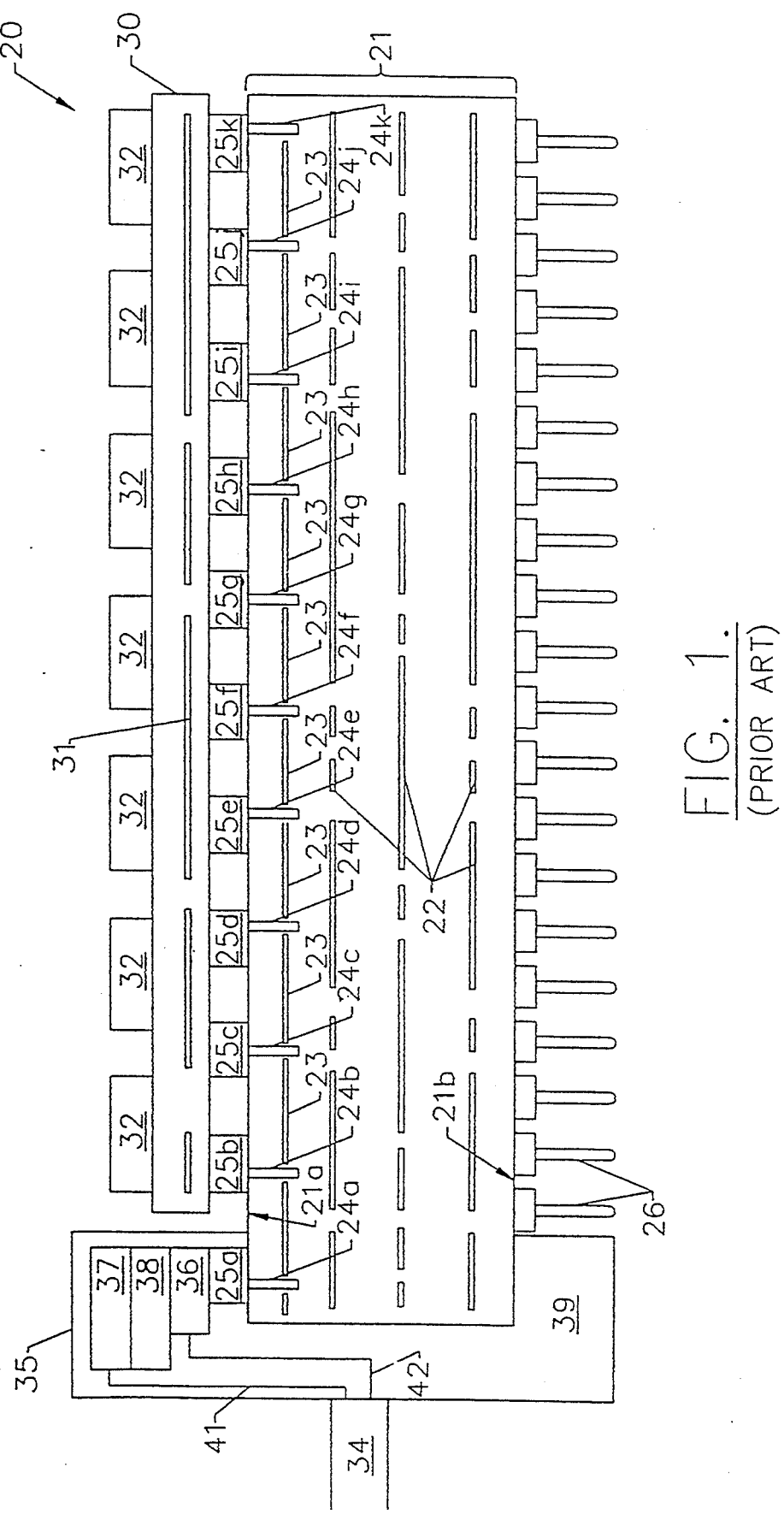
FIG. 1 is a side cross-sectional view of a known high density integrated circuit device package.

Referring now to FIG. 1, a conventional high density integrated circuit device package is shown. Package 20 includes a multilayer ceramic substrate 21. Multilayer ceramic substrate 21 includes a plurality of internal wiring conductors 22 including an internal ground plane 23. Conductor filled vias 24a–24k bring the internal wiring conductors 22 to a first (top) face 21a of substrate 21. A respective capture pad 25a–25k is electrically connected to a respective one of the conductor filled vias 24a–24k at the first face 21a of substrate 21. Although eleven capture pads are shown in the cross-section of FIG. 1, it will be understood that many more capture pads are typically included on the face of the multilayer ceramic substrate. An array of input/output pins 26 are attached to second (bottom) face 21b of multilayer ceramic substrate 21 using brazing or other known techniques.

A thin multilayer wiring substrate 30 is formed on capture pads 25b–25k, opposite multilayer ceramic substrate 21. The multilayer wiring substrate may be formed with thin-film processes using techniques which are well known to those having skill in the art. Multilayer wiring substrate 30 also includes a plurality of internal conductor layers therein (not shown in FIG. 1) and also includes a ground plane 31 therein. A plurality of microelectronic devices 32 such as integrated circuit chips or discrete components, are mounted on multilayer wiring substrate 30 opposite capture pads 25. Devices 32 may be mounted using controlled collapse chip connection (C-4) solder bump technology, surface mount technology or other known technologies (not shown in FIG. 1).

As also shown in FIG. 1, an edge connector 35 may also provide additional input/output connections to the substrate. An edge connector contact 36 is electrically connected to a corresponding capture pad 25a at an edge of substrate 21. An edge connector ground plane 37 is also provided. The ground plane 37 is separated from contact 36 by an edge connector insulating layer 38. The contact 36, insulating layer 38 and ground plane 37 are mounted in a housing 39 which also provides external input/output access through a cable 34 including a ground wire 41 and signal wire 42. It will be understood by those having skill in the art that an edge connector may include contacts 36 for many capture pads at an edge of the substrate.

As shown in FIG. 1, the capture pad size and the spacing between capture pads is uniform. For example, the capture pads may be 0.008"×0.008" in size, with a spacing of 0.008" between capture pads.

Figure 2:
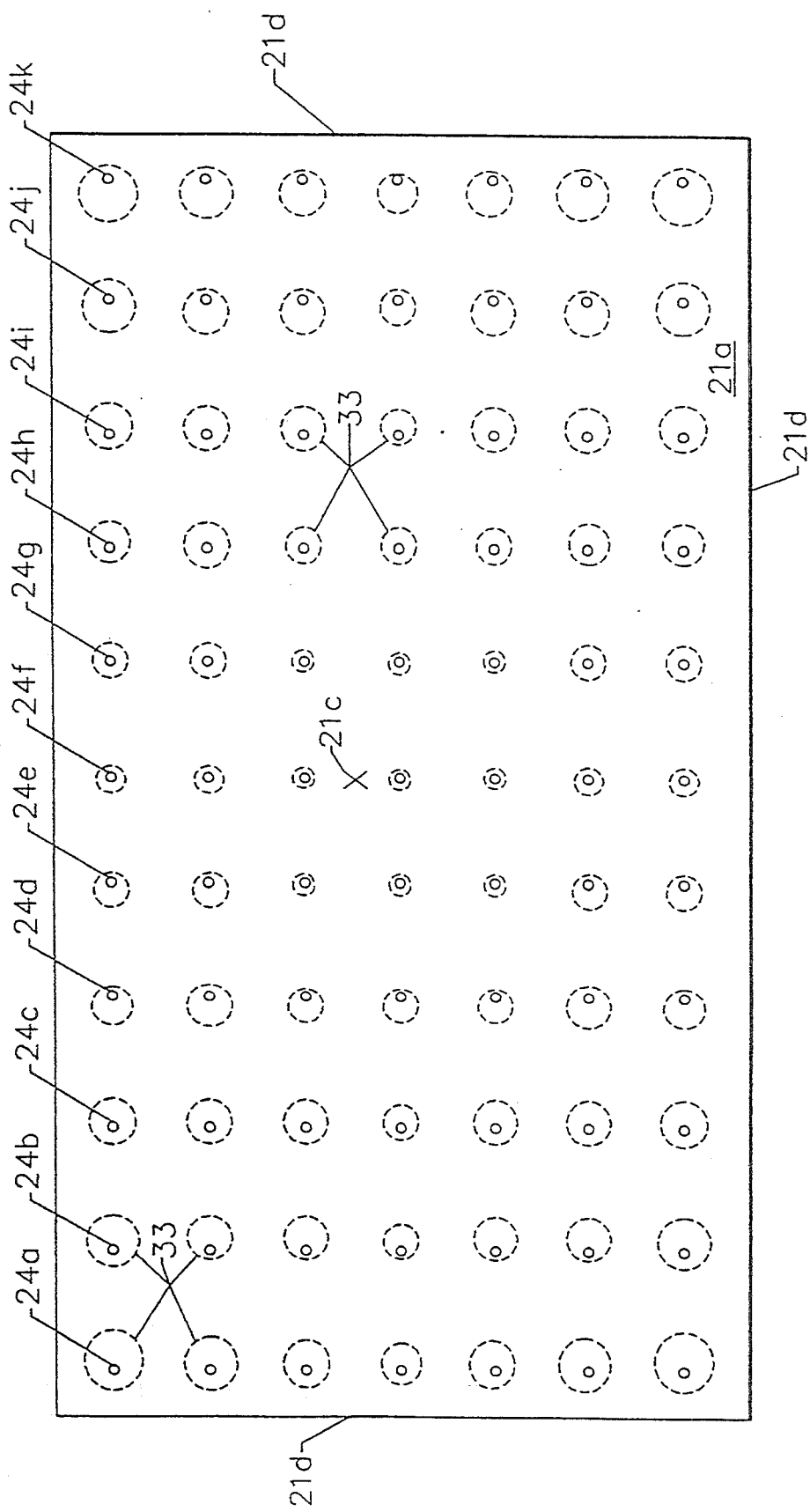
FIG. 2 is a top view of the multilayer ceramic substrate of the integrated circuit package of FIG. 1.

Referring now to FIG. 2, a top view of top face 21a of multilayer ceramic substrate 21 is illustrated prior to forming capture pads 25a–25k and multilayer wiring substrate 30 thereon. As shown, each conductor filled via 24 has a prescribed variation in possible position due to the nonuniform shrinkage of the ceramic green sheets during the sintering process. The variation in position is indicated by dashed circles 33.

In attempting to align two surfaces to one another where there is no one-to-one correspondence between the points of the two surfaces, it is possible to align only one point on each of the two surfaces accurately. All other points will be aligned within some tolerance, and this tolerance can be calculated or measured. The point having the minimum or zero alignment tolerance will be called the "neutral" or "reference" point herein. Typically, alignment tolerances are measured from the center of the face of the substrate 30 or the center of an edge of the substrate. However, it will be understood by those having skill in the art that other reference points may be used, for example at a corner of the substrate.

Still referring to FIG. 2, and assuming the reference point "x" is at the center 21c of the substrate face 21a, the uncertainty in via position is greater as the distance from the center 21c to the edges 21d of the top face 21a is approached, due to nonuniform shrinkage. As also shown, worst case variation is typically produced at the corners of the substrate face because the radial distance from the center is greatest. Moreover, along a row of vias at an edge of the substrate 21d, for example the row including vias 24a–24k, the greatest positional variation is present at the ends of the row (vias 24a and 24k). The variation increases as one moves outward from the center of the row (from via 24e).

Figure 3:
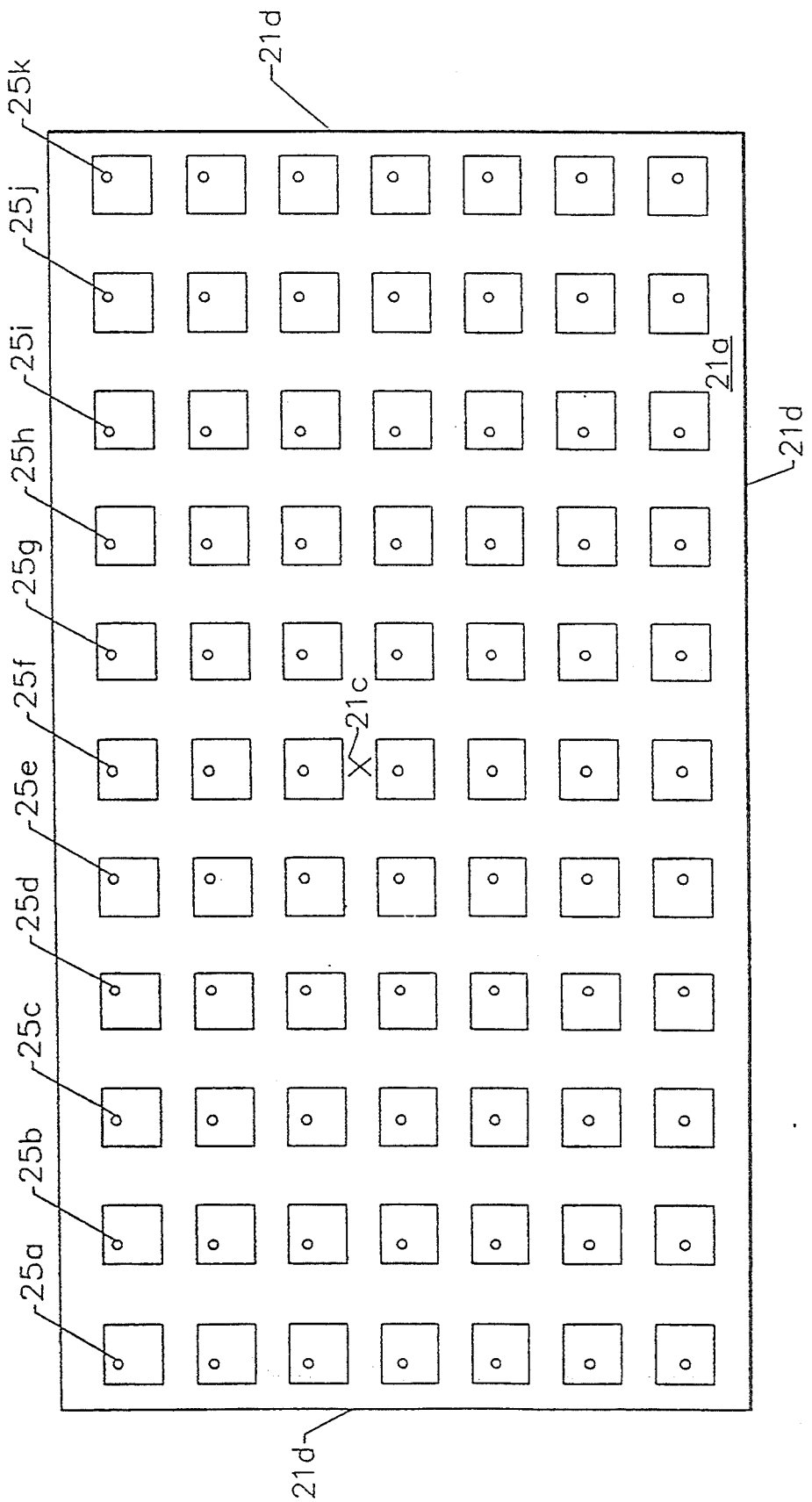
FIG. 3 is a top view of the capture pads of the integrated circuit package of FIG. 1.

In fabricating the capture pads on the multilayer ceramic substrate, it must be insured that every capture pad will be aligned to the underlying conductor filled via associated therewith, in order to establish electrical connection. Accordingly, the worst case dimensional variation is accommodated by forming all of the capture pads 25 sufficiently large to accommodate the worst case variation in position. Thus, as shown in FIG. 3, all of the capture pads 25 are made sufficiently large to accommodate the worst case variability in via location, possessed by vias 24a and 24k.

Figure 4:
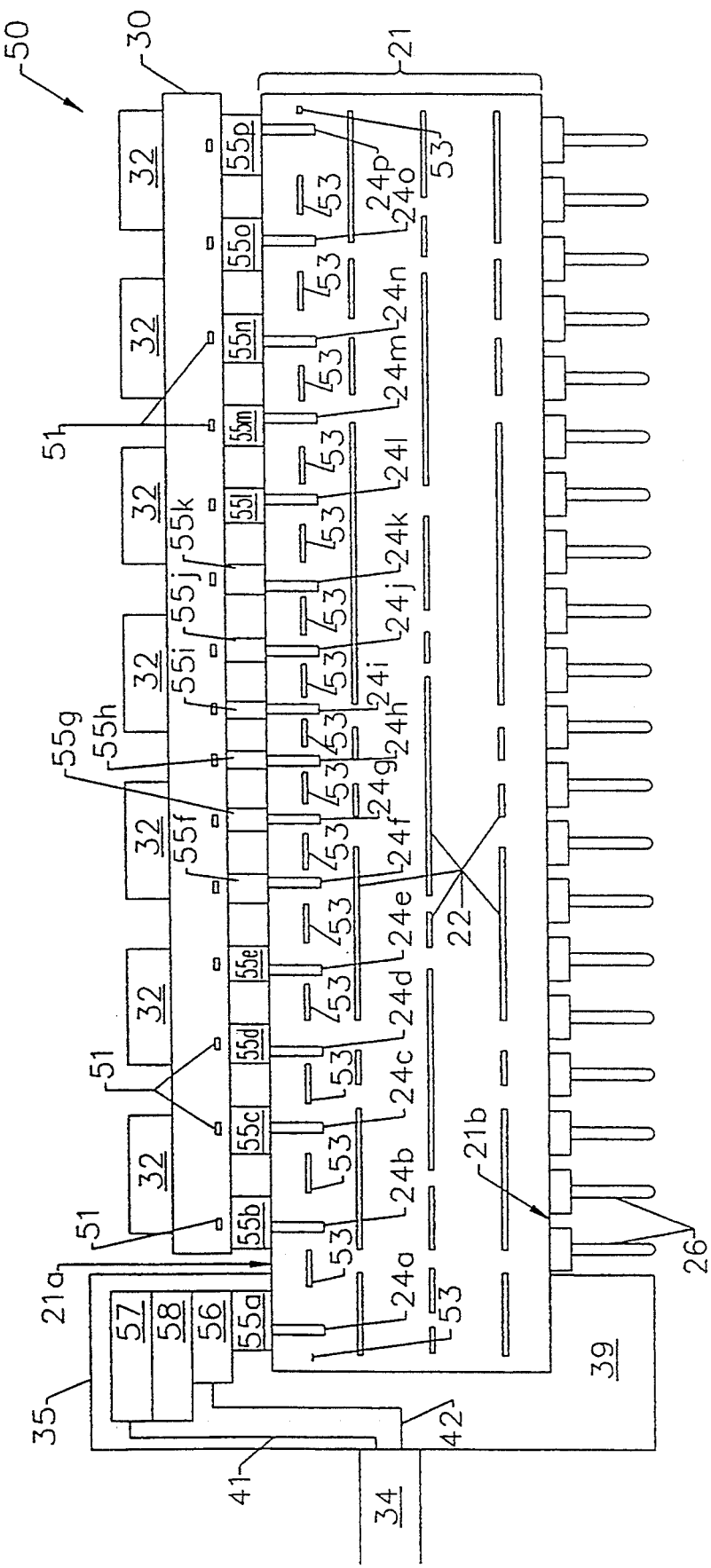
FIG. 4 is a side cross-sectional view of an integrated circuit package according to the present invention.

Referring now to FIG. 4, a microelectronic device package according to the present invention will now be described. As shown, microelectronic package 50 includes a multilayer ceramic substrate similar to substrate 21 described with respect to FIG. 1, except that a unique configuration of multilayer ceramic substrate ground plane 53 is provided as will be described in detail below. The multilayer wiring substrate 30 is similar to that described with regard to FIG. 1, except that a unique configuration of multilayer thin film wiring substrate ground plane 51 is provided as will be described below. Edge connector 35 is also provided with a unique configuration of edge connector contacts 56, ground plane 57 and insulating layer 58, as will be described below.

Figure 5:
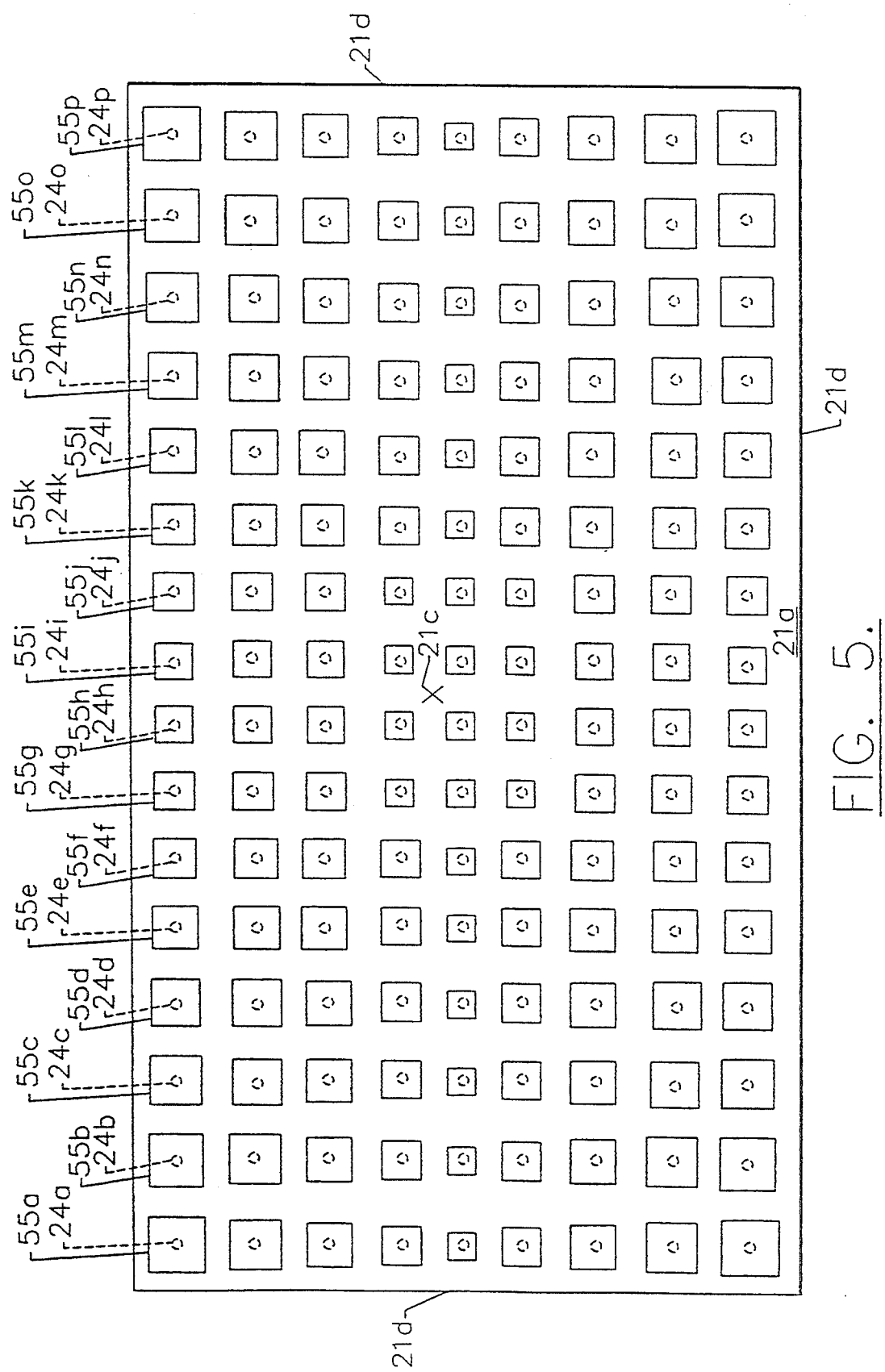
FIG. 5 is a top view of the capture pads of the integrated circuit package of FIG. 4.

FIG. 5 illustrates a top view of the multilayer ceramic substrate 21 of FIG. 4 including capture pads 55 thereon. As shown in FIGS. 4 and 5, according to the invention, and assuming a reference point x at the center 21c of face 21a, variable size capture pads 55a–55p are provided, with the capture pad size being relatively large adjacent the edges 21d of the substrate face 21a and being relatively small adjacent the center 21c of the substrate face 21a. In particular, and as shown in FIG. 5, the predetermined capture pad size progressively increases as the radial distance from the center 21c of the substrate face 21a increases. Stated another way, along each row of capture pads at edge 21d of the substrate face 21a, the size of the capture pads are relatively large adjacent the ends of the row of capture pads and relatively small adjacent the center of the row of capture pads. For example, in the row of capture pads 55a–55p, capture pads 55a and 55p are relatively large compared to capture pad 55f. The capture pad size progressively increases from the center pad 55f to the end pads 55a and 55p.

It will be understood by those having skill in the art that if a reference point x is chosen at a location other than at the center 21c, the capture pad size increases as the radial distance from the reference point x increases. Thus, if a reference point at the upper left corner is selected, the capture pad size will be smallest at the upper corner and will progressively increase as the radial distance from the upper left corner increases, with the pad in the lower right corner being largest. It will also be understood that in order to minimize the largest size capture pad which is required to accommodate the expected shrinkage variation, a reference point at the center of the face, or at the center of an edge, is preferably used.

According to the invention, oversized capture pads, each of which takes into account the worst case variability in via position, are not used. Rather, the variable size capture pads accommodate the expected shrinkage variation at each capture pad position. By sizing each capture pad based on the maximum possible variation at the particular pad position, higher contact density is obtainable than with known uniform size capture pads. Thus, only the capture pads furthest from the reference point will be large enough to accommodate the maximum worst case variation in via position. The size of capture pads closer to the reference point is progressively reduced, because smaller variations in via positions will be encountered closer to the reference point. Since the capture pads near the reference point are smaller than the capture pads far from the reference point, larger numbers of capture pads may be accommodated. A higher density substrate is thereby provided without increasing misalignment between the capture pads and the underlying vias.

Figure 6:
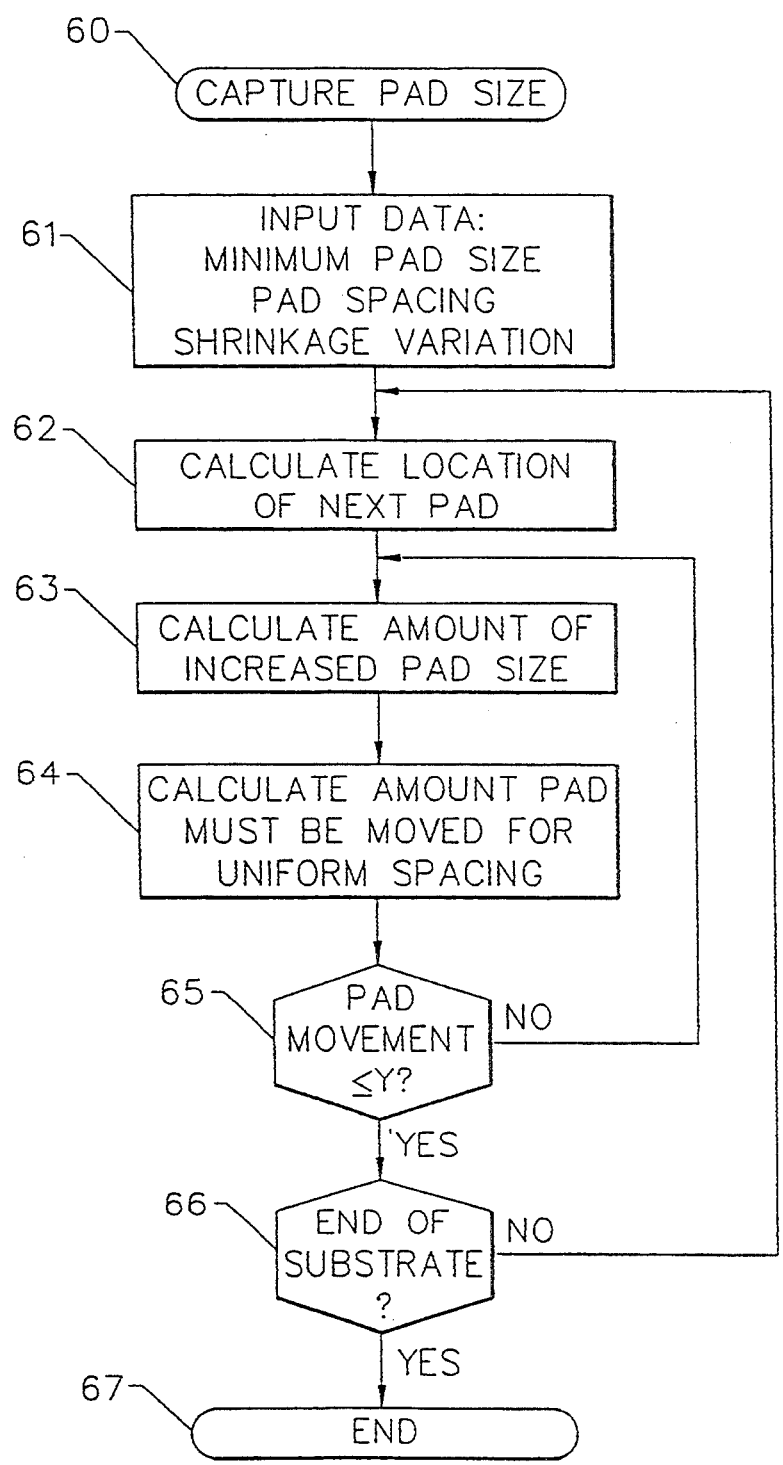
FIG. 6 illustrates operations for determining the size of the variable size capture pads of the present invention.

Referring now to FIG. 6, a process for determining the size of the variable size capture pads of the present invention will now be described. In particular, capture pad size is determined, at Block 60, by first providing input data at Block 61 based on the geometry of the multilayer ceramic substrate. The minimum capture pad size which can be fabricated, and the desired capture pad spacing and the shrinkage variation produced by the sintering process, are all provided. It will be understood by those having skill in the art that the steps described below assume fixed spacing between capture pads. However, variable spacing can also be accommodated. Typical data for present day multilayer ceramic substrates is 0.008"×0.008" minimum pad size, 0.008" pad spacing and 3% shrinkage variation.

Beginning at the center of the substrate, a starting location for the center pad is defined. The center pad has the minimum pad size. Then, at Block 62, the location of a next pad is calculated based on the assumed minimum pad spacing. For the location determined at Block 62, the amount of increased pad size is calculated at Block 63. The amount of increased pad size is calculated based upon the expected variability in shrinkage at the location calculated in Block 62.

Then, based on the amount of increased pad size, the pad is moved at Block 64 in order to reestablish uniform spacing. If the pad movement is below a predetermined distance "y", such as a predetermined percentage of the pad size (Block 65), then a recalculation need not be performed. However, if the pad movement is more than the predetermined distance, a new pad location is calculated and the size is recalculated in order to optimize the size.

After the location of the pad is fixed, and assuming the end of the substrate has not been reached (Block 66), the next location is calculated by returning to Block 62. Once the last substrate pad has been calculated, the process ends at Block 67.

It will be understood by those having skill in the art that the calculations of FIG. 6 may be performed manually, since they only need be performed once for a given substrate. Alternatively, the calculations may be performed on a programmed digital computer for increased speed. Regardless of how they are performed, these calculations establish the size of the variable size capture pads at any location on the substrate face.

As described in connection with FIGS. 4, 5 and 6 above, the variable size capture pads of the present invention allow more capture pads to be placed on a multilayer ceramic substrate face than would be the case for fixed size capture pads. However, the variable size capture pads will create variable capacitive coupling to the underlying ground plane in a multilayer ceramic substrate, which may degrade the high speed performance of the multilayer ceramic substrate. For example, FIG. 7 illustrates the variable capacitive coupling which would be created by the variable sized capture pads 55b and 55h of FIG. 4 if used with a conventional multilayer ceramic substrate 21 and multilayer wiring substrate 30 of FIG. 1.

Figure 7:
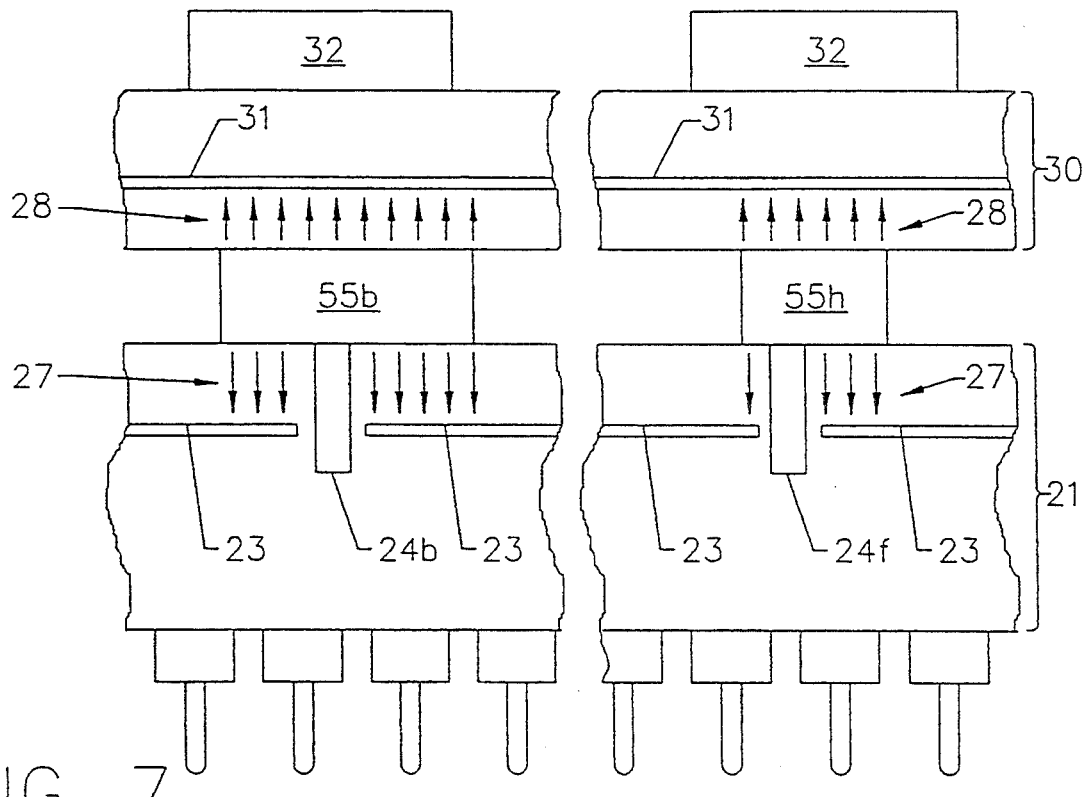
FIG. 7 is a detailed side cross-sectional view illustrating capacitive coupling between variable size capture pads and conventional ground planes.

As shown in FIG. 7, arrows 27 indicate the capacitive coupling between the capture pads and the ground plane 23 of the multilayer ceramic substrate 21, and arrows 28 indicate the capacitive coupling between the capture pads and the ground plane 31 of multilayer wiring substrate 30. As shown, greater capacitive coupling exists with the larger capture pad 55b compared with the smaller capture pad 55h. The multilayer ceramic substrate and/or multilayer wiring substrate could be designed to vary the signal propagation paths or apply compensation capacitors to equalize the capacitive coupling for the variable size capture pads. A preferred solution to the variable capacitance problem associated with the variable size capture pads will now be described in connection with FIG. 8.

Figure 8:
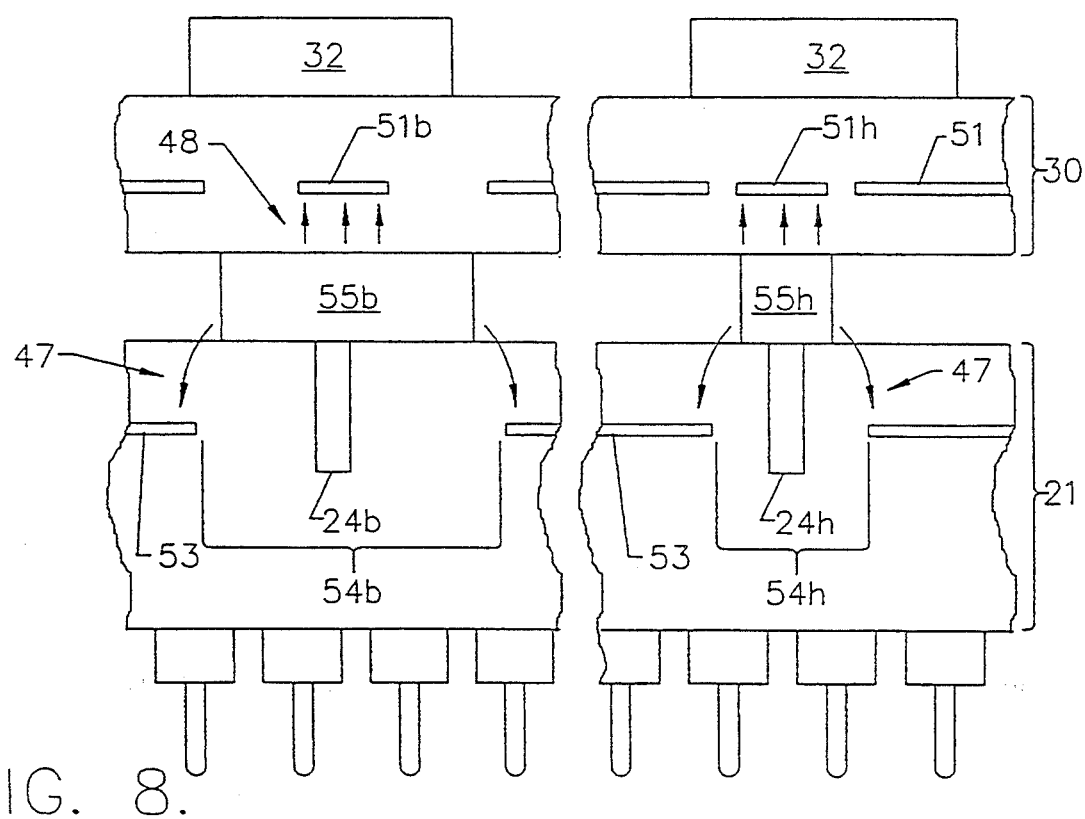
FIG. 8 is a detailed side cross-sectional view illustrating capacitive coupling between the variable size capacitive capture pads and the ground planes of the present invention.

Referring now to FIG. 8, variable size capture pads are shown with modified ground planes 53 and 51 of FIG. 4. As shown in FIG. 8, apertures are formed in the ground plane of the multilayer ceramic substrate adjacent the capture pads, in order to minimize capacitive coupling between the capture pad and the ground plane of the multilayer ceramic substrate. Also, small uniform size ground plane regions are formed adjacent the capture pads in the multilayer wiring substrate to produce a fixed capacitive coupling regardless of the size of the capture pad. Accordingly, a uniform size ground plane region is provided adjacent each capture pad, with the uniform size being smaller than the smallest capture pad. Capacitive ground plane coupling is then governed by the uniform size ground plane regions, notwithstanding the variable size capture pads.

In particular, referring to FIG. 8, multilayer ceramic substrate ground plane 53 includes a plurality of apertures 54b, 54h of predetermined size therein, a respective one of which is adjacent a respective one of the capture pads 55b, 55h. As shown in FIG. 8, the predetermined aperture size is proportional to the predetermined size of the capture pad adjacent thereto, and in particular, the predetermined aperture size is at least equal to the predetermined capture size of the capture pad adjacent thereto. Accordingly, minimal capacitive coupling between the capture pad 55 and the ground plane 53 is provided, as shown by arrows 47.

Moreover, as also shown in FIG. 8, the multilayer wiring substrate 30 includes an internal ground plane 51 including a plurality of ground plane regions 51b, 51h of the same predetermined (uniform) size, a respective one of which is adjacent a respective one of the capture pads 55b, 55h. The uniform size of the regions 51b, 51h is smaller than the smallest of the plurality of capture pads 55h. Accordingly, the capacitive coupling between ground plane 51 and the capture pads is determined solely by the size of the regions 51b, 51f, which are all the same size. The capacitive coupling between the capture pads and the ground plane regions is therefore equal, even though the capture pads are of variable size. Signal degradation resulting from variable capacitive coupling to the variable size capture pads is thereby reduced or eliminated.

It will be understood by those having skill in the art that regions in thin film wiring substrate 30 can be more precisely defined than regions in multilayer ceramic substrate 21. Accordingly, the ground plane coupling between the variable size capture pads is preferably provided through ground plane 51 of multilayer wiring substrate 30, and coupling between the multilayer ceramic substrate ground plane 53 and the variable size capture pads is preferably minimized. Uniform coupling may also be provided by capacitively coupling to uniform size ground plane regions in the multilayer ceramic substrate or by ground plane regions in both the multilayer ceramic substrate and multilayer wiring substrate.

Figure 9:
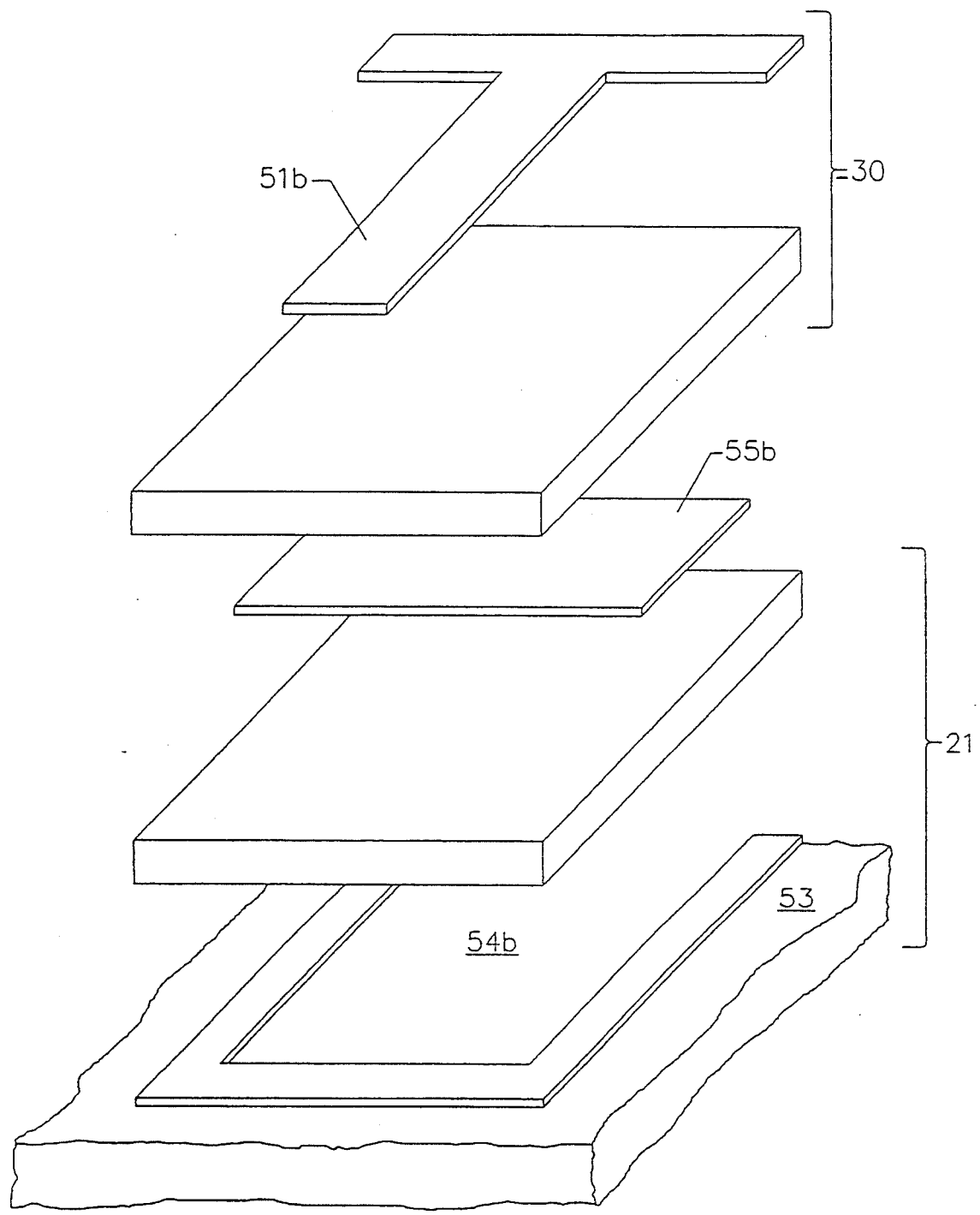
FIG. 9 is a three-dimensional exploded view of a capture pad and the ground planes of FIG. 8.

FIG. 9 illustrates a three-dimensional exploded view of the coupling of one capture pad 55b of FIG. 8. As shown, aperture 54b is provided in the multilayer ceramic substrate 21 ground plane 53 under the capture pad 55b to reduce or eliminate coupling thereto. A small region 51b of ground plane 51 is formed in the thin film wiring substrate 30 to provide a fixed amount of capacitive coupling to the capture pad.

Figure 10:
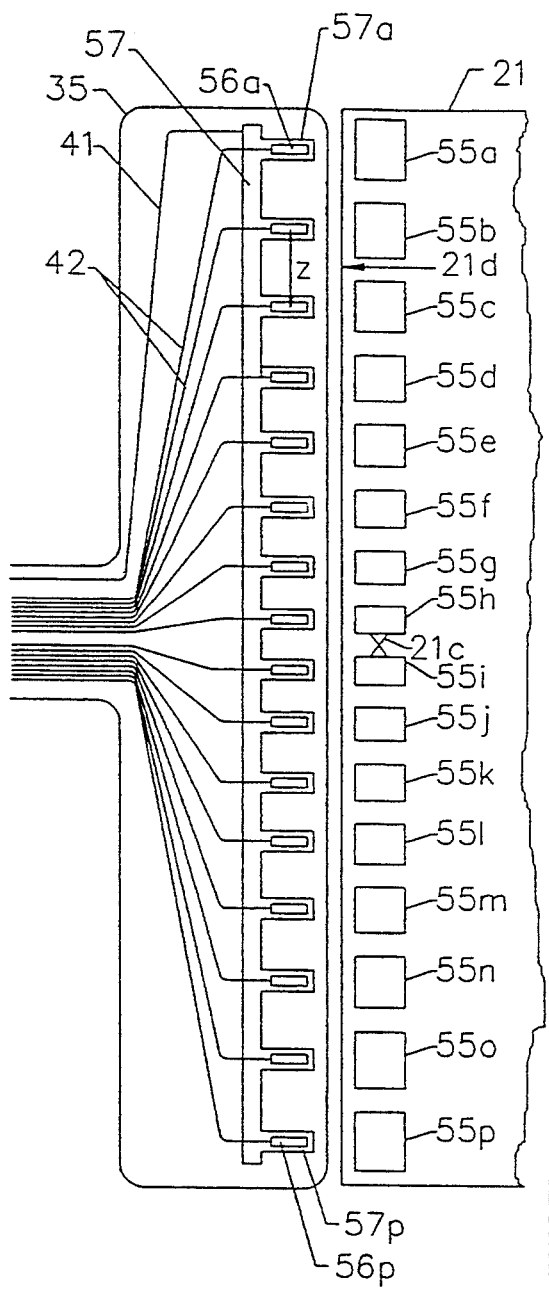
FIG. 10 is a top view of the edge of a substrate and an edge connector according to the present invention.

The above description has focused upon the formation of capture pads for mounting a thin film wiring substrate thereon. However, it will also be understood by those having skill in the art that the capture pads may be formed in a row along the edge of multilayer ceramic substrate 21 for connection of an edge connector thereto, instead of or in addition to the capture pads for the multilayer wiring substrate. FIG. 10 illustrates such an edge connector. The reference or neutral point "x" is assumed to be in the center of the row of capture pads. As shown in FIG. 10, a row of variable size capture pads 55a–55p is formed an edge 21d of multilayer ceramic substrate 21. A corresponding connector 35 includes contacts 56a–56p with variable center-to-center spacing "z" between adjacent contacts. The contacts may be uniform size, as shown in FIG. 10. Alternatively, the contacts may be variable in size to correspond to the variable size capture pads. A ground plane 57 with same size regions 57a is shown above contacts 56a–56p. Insulating layer 38 is not shown for purposes of clarity. As shown in FIG. 10, each capture pad in the row of capture pads may have the same length and a variable width. Alternatively, both length and width may be varied as was the case in FIGS. 4–5.

Figure 11A:
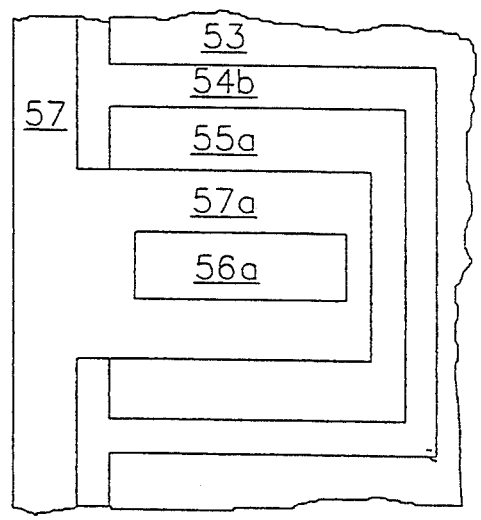
FIGS. 11A and 11B are an exploded top view and a side cross-sectional view, respectively, of a capture pad and the surrounding regions of FIG. 10.
Figure 11B:
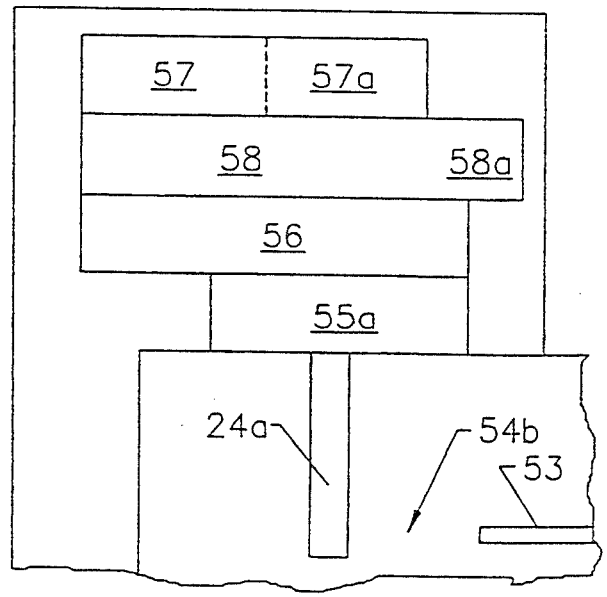

FIGS. 11A and 11B illustrate an exploded top view and cross-section respectively, of one capture pad 55a and the surrounding regions of FIG. 10. As shown, dielectric layer 58 is extended at region 58a to provide control of the fields at the tips of the conductors. High density, high speed edge connectors are thereby provided.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed:

1. An electrical connector comprising:
 a housing;
 a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts; and
 a ground plane coupled to said housing, and extending parallel to said row of connector contacts, said ground plane including a plurality of ground plane regions of same predetermined size, a respective one of which is adjacent a respective one of said connector contacts.

2. An electrical connector comprising:
 a housing;
 a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts;
 wherein said imaginary reference point is at the center of said row of said connector contacts, said predetermined center-to-center spacing being relatively large adjacent the ends of said row of contacts and being relatively small adjacent the center of said row of contacts; and
 wherein the size of said connector contacts progressively increases from the center of said row no the ends of said row.

3. An electrical connector comprising:
 a housing;
 a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts; and wherein each of said connector contacts has a predetermined size, said predetermined size being relatively large relatively far from said imaginary reference point and being relatively small near the imaginary reference point.

4. The electrical connector of claim 3 wherein said predetermined size progressively increases from said imaginary reference point.

5. An electrical connector comprising:
a housing;
a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts; and
an electrical cable, electrically connected to each of said connector contacts, and extending from said housing.

6. The electrical connector of claim 5 wherein said imaginary reference point is at the center of said row of said connector contacts, said predetermined center-to-center spacing being relatively large adjacent the ends of said row of contacts and being relatively small adjacent the center of said row of contacts.

7. The electrical connector of claim 6 wherein said predetermined center-to-center contact spacing progressively increases from the center of said row to the ends of said row.

8. The electrical connector of claim 6 wherein said predetermined center-to-center contact spacing of at least some of said connector contacts progressively increases from the center of said row to the ends of said row.

9. An electrical connector comprising:
a housing;
a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts; and
a multilayer ceramic substrate, said multilayer ceramic substrate comprising:
a substrate of ceramic material having an internal conductor system including a plurality of conductor filled vias extending to a face thereof; and
a row of capture pads of a predetermined size and of said predetermined center-to-center spacing on said substrate face, a respective one of which is electrically connected to a respective one of said conductor filled vias, said predetermined capture pad size being relatively large relatively far from said imaginary reference point in said row of capture pads and being relatively small relatively near the imaginary reference point in said row of capture pads such that said predetermined capture pad size and said predetermined center-to-center spacing of at least some of said capture pads in said row progressively increase as to the distance from the imaginary reference point in said row of capture pads increases, to ensure electrical connection to the respective conductor filled via notwithstanding variability in location of the respective via due to shrinkage of said substrate during fabrication thereof.

10. An electrical connector comprising:
a housing;
a row of connector contacts coupled to said housing, said row of connector contacts having predetermined center-to-center spacing between adjacent contacts, said predetermined center-to-center spacing being relatively large relatively far from an imaginary reference point in said row of connector contacts and being relatively small relatively near the imaginary reference point in said row of connector contacts; and
said electrical connector being adapted for electrical connection of said row of connector contacts to a multilayer ceramic substrate, said multilayer ceramic substrate comprising:
a substrate of ceramic material having an internal conductor system including a plurality of conductor filled vias extending to a face thereof; and
a row of capture pads of a predetermined size and of said predetermined center-to-center spacing on said substrate face, a respective one of which is electrically connected to a respective one of said conductor filled vias, said predetermined capture pad size being relatively large relatively far from said imaginary reference point in said row of capture pads and being relatively small relatively near the imaginary reference point in said row of capture pads such that said predetermined capture pad size and said predetermined center-to-center spacing of at least some of said capture pads in said row progressively increase as to the distance from the imaginary reference point in said row of capture pads increases, to ensure electrical connection to the respective conductor filled via notwithstanding variability in location of the respective via due to shrinkage of said substrate during fabrication thereof.

11. The electrical connector of claim 31 further comprising:
a dielectric layer between said ground plane regions and said row of connector contacts, said dielectric layer extending beyond an edge of each of said ground plane regions.

12. An electrical connection system comprising:
a substrate of ceramic material having an internal conductor system including a plurality of conductor filled vias extending to a face thereof;
a row of capture pads of predetermined size and predetermined center-to-center spacing on said substrate face, a respective one of which is electrically connected to a respective one of said conductor filled vias, said predetermined capture pad size and said predetermined center-to-center spacing being relatively large relatively far from an imaginary reference point in said row of capture pads and being relatively small relatively near the imaginary reference point in said row of capture pads such that said predetermined capture pad size and said predetermined center-to-center spacing of at least some of said capture pads in said row progressively increase as to the distance from the imaginary reference point in said row of capture pads increases, to ensure electrical connection to the respective conductor filled via notwithstanding variability in location of the respective via due to shrinkage of said substrate during fabrication thereof; and a row of connector contacts, said row of connector contacts having said predetermined center-to-center spacing between adjacent contacts, such that a respective one of said connector contacts electrically contacts a respective one of said capture pads.

13. The electrical connection system of claim 12 wherein said imaginary reference point is at the center of said row of capture pads, said predetermined center-to-center spacing being relatively large adjacent the ends of said row of capture pads and being relatively small adjacent the center of said row of capture pads.

14. The electrical connection system of claim 13 wherein said predetermined center-to-center spacing progressively increases from the center of said row to the ends of said row.

15. The electrical connection system of claim 12 further comprising a ground plane extending parallel to said row of connector contacts, said ground plane including a plurality of ground plane regions of same predetermined size, a respective one of which is adjacent a respective one of said connector contacts.

16. The electrical connection system of claim 13 wherein the size of said capture pads progressively increases from the center of said row to the ends of said row.

17. The electrical connection system of claim 13 wherein said predetermined center-to-center spacing of at least some of said capture pads progressively increases from the center of said row to the ends of said row.

18. The electrical connection system of claim 12 wherein each of said connector contacts has a predetermined size, said predetermined size being relatively large relatively far from said imaginary reference point and being relatively small near the imaginary reference point.

19. The electrical connection system of claim 18 wherein said predetermined size progressively increases from said imaginary reference point.

20. The electrical connection system of claim 12 further comprising:

an electrical cable, electrically connected to each of said connector contacts.

21. The electrical connection system of claim 15 further comprising:

a dielectric layer between said ground plane regions and said row of connector contacts, said dielectric layer extending beyond an edge of each of said ground plane regions.

* * * * *